United States Patent
Vissiere et al.

(10) Patent No.: US 11,815,363 B2
(45) Date of Patent: Nov. 14, 2023

(54) METHOD FOR CALIBRATING A GYROMETER OF AN OBJECT

(71) Applicant: SYSNAV, Vernon (FR)

(72) Inventors: David Vissiere, Paris (FR); Mathieu Hillion, Vernon (FR); Hendrik Meier, Vernon (FR)

(73) Assignee: SYSNAV, Vernon (FR)

( * ) Notice: Subject to any disclaimer, the term of this patent is extended or adjusted under 35 U.S.C. 154(b) by 393 days.

(21) Appl. No.: 17/251,106

(22) PCT Filed: Jun. 12, 2019

(86) PCT No.: PCT/FR2019/051415
§ 371 (c)(1),
(2) Date: Dec. 10, 2020

(87) PCT Pub. No.: WO2019/239063
PCT Pub. Date: Dec. 19, 2019

(65) Prior Publication Data
US 2021/0254998 A1     Aug. 19, 2021

(30) Foreign Application Priority Data

Jun. 13, 2018  (FR) ...................................... 1855169

(51) Int. Cl.
*G01C 25/00*    (2006.01)
*G01C 21/16*    (2006.01)
(Continued)

(52) U.S. Cl.
CPC ........... *G01C 25/005* (2013.01); *G01C 21/16* (2013.01); *G01C 21/1654* (2020.08); *G01C 22/00* (2013.01); *G01R 33/0206* (2013.01)

(58) Field of Classification Search
CPC .................. G01C 25/005; G01C 22/00; G01R 33/0206
See application file for complete search history.

(56) References Cited

U.S. PATENT DOCUMENTS

| 2004/0123474 A1 | 7/2004 | Manfred et al. |
| 2009/0005985 A1* | 1/2009 | Basnayake ............. G01C 25/00 701/501 |

(Continued)

FOREIGN PATENT DOCUMENTS

| FR | 2914739 A1 | 10/2008 |
| FR | 3069053 A1 | 1/2019 |

(Continued)

OTHER PUBLICATIONS

Chesneau et al., "Motion estimation of a rigid body with an EKF using magneto-inertial measurements", 7th Conf. on Indoor Positioning and Indoor Navigation (IPIN'16), Oct. 2016, 7 pages.

(Continued)

*Primary Examiner* — Natalie Huls
*Assistant Examiner* — Cynthia L Davis
(74) *Attorney, Agent, or Firm* — WOMBLE BOND DICKINSON (US) LLP

(57) ABSTRACT

The present invention relates to a method for calibrating a gyrometer (11) of an object (1) moving in an ambient magnetic field, the method being characterised in that it comprises the steps of:
  (a) Acquisition by the gyrometer (11) of a measured angular velocity, and by magnetic measuring means (20) secured to said object (1) of at least two components of the magnetic field;
  (b) Determination of values of at least one calibration parameter of the gyrometer (11) minimising a first expression defined by an estimated angular velocity of the object (1) and at least one first magnetic equation on the components of the magnetic field,
  the estimated angular velocity being a function of the measured angular velocity and of calibration parameters, and (Continued)

the at least one first magnetic equation assuming that the magnetic field is uniform and stationary.

20 Claims, 2 Drawing Sheets

(51) Int. Cl.
    *G01C 22/00*    (2006.01)
    *G01R 33/02*    (2006.01)

(56) References Cited

U.S. PATENT DOCUMENTS

| | | |
|---|---|---|
| 2011/0178707 A1 | 7/2011 | Sachs et al. |
| 2012/0116716 A1* | 5/2012 | Lokshin .............. G01C 19/00 |
| | | 702/150 |
| 2012/0259572 A1* | 10/2012 | Afzal ................ G01C 21/183 |
| | | 702/92 |
| 2013/0073253 A1 | 3/2013 | Handa |
| 2014/0202229 A1 | 7/2014 | Stanley |
| 2014/0336970 A1* | 11/2014 | Troni-Peralta ....... G01C 25/005 |
| | | 702/96 |

FOREIGN PATENT DOCUMENTS

| | | |
|---|---|---|
| FR | 3069649 A1 | 2/2019 |
| JP | 06-034379 A | 2/1994 |
| JP | 2013-064695 A | 4/2013 |

OTHER PUBLICATIONS

Dorveaux et al., "Iterative calibration method for inertial and magnetic sensors", 48th IEEE Conference on Decision and Control, Dec. 2009, pp. 8296-8303.

International Preliminary Report on Patentability received for PCT Patent Application No. PCT/FR2019/051415, dated Dec. 24, 2020, 18 pages (9 pages of English Translation and 9 pages of Original Document).

International Search Report and Written Opinion received for PCT Patent Application No. PCT/FR2019/051415, dated Nov. 7, 2019, 22 pages (9 pages of English Translation and 13 pages of Original Document).

Office Action received for European Patent Application No. 19745680.9, dated Jun. 6, 2023, 8 pages.

Office Action received for Japanese Patent Application No. 2020-569006, dated Apr. 25, 2023, 11 pages (6 pages of English Translation and 5 pages of Office Action).

\* cited by examiner

METHOD FOR CALIBRATING A GYROMETER OF AN OBJECT

TECHNICAL FIELD GENERAL

The present invention relates to the field of navigation without GNSS.

More precisely, it relates to a method for calibrating a gyrometer which is secured to a magnetometers.

STATE OF THE ART

It is today common to track the position of a vehicle via GNSS (Global Navigation Satellite System, for example GPS) or by using a wireless communication network (triangulation using emitting terminals, wifi network or others).

These methods are very limited because they do not make it possible to ensure availability and precision of the information, one and the other being affected by any maskings between the sources and the receiver. They are also dependent on external technologies such as satellites for GNSS which may be unavailable and even voluntarily scrambled.

Alternatively, "autonomous" methods are also known to track in any environment the relative displacement of a vehicle thanks for example to an inertial or magneto-inertial unit. "Relative displacement" means the trajectory of the vehicle in space with respect to a point and a data marker at initialisation. In addition to the trajectory, these methods also make it possible to obtain the orientation of the vehicle with respect to the same initial marker.

A navigation class inertial unit is formed at least from three accelerometers and from three gyrometers with a tri-axis arrangement. Typically, the gyrometers "maintain" a marker, wherein a double temporal integration of the measurements of accelerometers make it possible to estimate the movement.

It is in particular known that in order to be able to use the conventional inertial navigation methods, such as implemented in complex applications such as the navigation of fighter planes or commercial aircraft, submarines, vessels, etc., it is necessary to use very high-precision sensors. Indeed the double temporal integration of an acceleration measurement means that a constant error in acceleration creates an error in position which increases in proportion to the square of the time.

Alternatively, it is known that if the velocity vector information in the marker of the carrier can be provided by an external source (odometry on a car, log on a ship, Pitot tube on an aircraft), it is possible to obtain the trajectory of the carrier when it is possible to know its orientation and in particular its heading.

In a certain number of cases, the initial heading is known (initial "alignment" of an inertial device) and can be obtained by sensors other than inertial (for example magnetic) or deduced directly from inertial sensors when the latter make it possible to measure the terrestrial rotation precisely.

The difficulty if it is desired to work with low-cost sensors is to "increase" their performance by continuously calibrating their error parameters, in such a way as to maintain as best as possible the orientation information of a carrier, in particular the heading information on a terrestrial vehicle.

It has consequently been proposed in this context to calibrate a gyrometer using magnetic measurements.

Application US2012/0116716 proposes to examine if the change in a magnetic field between two measurement points corresponds to the predicted change in attitude by the integration of gyrometers. It however makes the assumption that the magnetometric/accelerometric measurements are reliable, which is delicate. Indeed, it is observed in practice that:

- the ambient magnetic field is not always homogeneous and stationary,
- the metallic elements (for example bodywork) or magnets in the vicinity have an impact on the magnetic measurement (effects of the soft iron and hard iron type), see also application US2004/0123474.

To correctly calibrate a magnetometer, it is necessary to place it in a maximum of spatial orientation so as to "excite the error model" in order to have observability. This problem is easily resolved for a piece of equipment that can be carried by hand and that can thus be turned in all directions, see for example application FR1757082, before using it. If on the contrary the magnetometer is fitted on a vehicle, there is a limitation:

- by the fact that during a typical travel of a vehicle, roll and pitch deviate from zero only slightly.
- by the fact that the body becomes magnetised, or the vehicle is loaded, which means that the calibration may no longer be pertinent; which will require regular recalibration.

Application US2011/0178707 more precisely relates to devices of the smartphone type that comprise a magnetic compass and a gyrometer, and mentions the problem of magnetic disturbances. This application aims rather the calibration of the magnetic compass using gyrometric data, but also proposes the reverse (i.e. the calibration of a gyrometer using magnetic data), taking as a point of departure a magneto-accelerometric quaternion and by obtaining the recalibration angular velocity from this quaternion $\omega = 2q^{-1}\dot{q}$. However, the assumption is still made that the magnetometric/accelerometric measurements are reliable, and in the opposite case it is simply proposes to not update the bias of the gyrometer as long as this situation lasts, or to use a default quaternion stored in a memory.

It would be desirable to have a new method for calibrating a gyrometer of an object for the purpose of estimating the movement of this object that allows for excellent quality of the result and is not restrictive.

Presentation of the Invention

The present invention thus relates, according to a first aspect, to a method for calibrating a gyrometer of an object moving in an ambient magnetic field, the method being characterised in that it comprises the steps of:

(a) Acquisition
   - by the gyrometer, of a measured angular velocity of the object, and
   - by magnetic measuring means which are secured to said object, of at least two components of the magnetic field and/or of an i-th derivative of the magnetic field, around the magnetic measurement means;

(b) Determining, by data processing means, values of at least one calibration parameter of the gyrometer minimising a first expression defined by an estimated angular velocity of the object and at least one first magnetic equation on the components of the magnetic field and/or of an i-th derivative of the magnetic field,
   the estimated angular velocity of the object being a function of the measured angular velocity and of calibration parameters of the gyrometer, and the at least one first magnetic equation assuming that the magnetic field is uniform and stationary around the magnetic measurement means.

According to other advantageous and non-limiting characteristics:

the estimated angular velocity $\omega_{gyro}^{(estimation)}$ of the object is linked to the measured angular velocity $\omega_{gyro}^{(measurement)}$ by a model $\omega_{gyro}^{(estimation)}=D\cdot(\omega_{gyro}^{(measurement)}+b_{gyro})$, where D and $b_{gyro}$ are the calibration parameters of the gyrometer;

the method further comprises a step (c) of estimating a parameter representative of an error on the calibration parameters;

the method further comprises, if said parameter representative of an error is greater than a predetermined threshold, a step (d) of acquiring, by acquisition additional means, a measured linear velocity of the object, and of re-determining, by the data processing means, values of at least one calibration parameter of the gyrometer minimising a second expression defined by the estimated angular velocity of the object and at least one second magnetic equation on the measured linear velocity and the components of the magnetic field and/or of an i-th derivative of the magnetic field, the at least one second magnetic equation assuming that the magnetic field is stationary around the magnetic measurement means;

the method comprises a step (e) of a new estimating of said parameter representative of an error on the calibration parameters;

said parameter representative of an error on the calibration parameters is a function of the value of said first expression, or where applicable of said second expression, calculated for the determined values of the calibration parameters;

the step (c), and where applicable the step (e), comprises determining an accumulated error interval according to the value of said parameter representative of an error on the calibration parameters and of a duration since the last calibration of the gyrometer, said predetermined threshold depending on said accumulated error interval;

step (b), and where applicable step (d) comprises the implementation of a recursive filter or of an optimisation;

the components of the magnetic field and/or of an i-th derivative of the magnetic field acquired in step (a) are measured components, and those used by said first and second magnetic equations are estimated components as a function of the measured components and of calibration parameters of the magnetic measuring means, the step (b) and, where applicable the step (d), also comprising the determining of values of at least one calibration parameter of the magnetic measuring means;

the magnetic measuring means are tri-axes magnetometers, the estimated components $M^{(estimation)}$ of the magnetic field being linked to the measured components $M^{(measurement)}$ by a model $M^{(measurement)}=A\cdot M^{(estimation)}+b_{magneto}$, where A and $b_{magneto}$ are the calibration parameters of the magnetic measuring means;

the first magnetic equation or equations are of the form $\nabla_n M=f_n(\omega)\times\nabla_n M$, and where applicable the second magnetic equation or equations are of the form $\nabla_n M=f_n(\omega)\times\nabla_n M+g_n(\nabla_{n+1}M)\cdot V$, where $\nabla_n M$ is an n-th derivative of the magnetic field, $\omega$ the angular velocity, V the linear velocity, and $f_n$ and $g_n$ predetermined functions;

the first magnetic equation is $\dot{M}=-\omega\times M$, and where applicable the second magnetic equation is $\dot{M}=-\omega\times M+\nabla M\cdot V$;

the first expression is a function of $|\nabla_n M^{(estimation)}-f_n(\omega_{gyro}^{(estimation)})\times\nabla_n M^{(estimation)}|$ and the optional second expression is a function of $|\nabla_n M^{(estimation)}-f_n(\omega_{gyro}^{(estimation)})\times\nabla_n M^{(estimation)}-g_n(\nabla_{n+1}M^{(estimation)})\cdot V|$.

said parameter representative of an error on the calibration parameters is either the mean of $|\nabla_n M^{(estimation)}-f_n(\omega_{gyro}^{(estimation)})\times\nabla_n M^{(estimation)}|^2$ or $|\nabla_n M^{(estimation)}-f_n(\omega_{gyro}^{(estimation)})\times\nabla_n M^{(estimation)}-g_n(\nabla_{n+1}M^{(estimation)})\cdot V|^2$ over a given time interval, or all or a portion of a spatial gradient of said components of the magnetic field and/or of an i-th derivative of the magnetic field, the method comprises a step (f) of estimating by the data processing means the movement of said object (1) according to the measured angular velocity of the object, the components of the magnetic field and/or of an i-th derivative of the magnetic field, and/or of any measured linear velocity of the object, and of any measured linear velocity of the object, wherein an orientation of the vehicle is estimated in step (f) only as a function of the measured angular velocity of the vehicle and of values of the calibration parameters.

According to a second aspect, an object moving in an ambient magnetic field is proposed, comprising a gyrometer configured to acquire a measured angular velocity of the object, magnetic measuring means configured to acquire at least two components of the magnetic field and/or of an i-th derivative of the magnetic field, the object being characterised in that it further comprises data processing means configured to:

determine values of at least one calibration parameter of the gyrometer minimising a first expression defined by an estimated angular velocity of the object and at least one first magnetic equation on the components of the magnetic field and/or of an i-th derivative of the magnetic field, the estimated angular velocity of the object being a function of the measured angular velocity and of calibration parameters of the gyrometer, and the at least one first magnetic equation assuming that the magnetic field is uniform and stationary around the magnetic measurement means.

According to other advantageous and non-limiting characteristics:

the object further comprises additional acquisition means configured to acquire a measured linear velocity of the object, the data processing means furthermore being configured to:

Estimate a parameter representative of an error on the calibration parameters; and If said parameter representative of an error is greater than a predetermined threshold, re-determine values of at least one calibration parameter of the gyrometer minimising a second expression defined by the estimated angular velocity of the object and at least one second magnetic equation on the measured linear velocity and the components of the magnetic field and/or of an i-th derivative of the magnetic field, the at least one second magnetic equation assuming that the magnetic field is stationary around the magnetic measurement means;

The object is a vehicle with wheels, the additional acquisition means being at least two odometers fitted on the wheels of the vehicle.

According to a third and a fourth aspect, are proposed a computer program product comprising code instructions for the execution of a method according to the first aspect of the invention for calibrating a gyrometer; and a storage means readable by a piece of computer equipment whereon a computer program product comprises code instructions for the execution of a method according to the first aspect of calibrating a gyrometer.

PRESENTATION OF THE FIGURES

Other characteristics and advantages of the present invention shall appear when reading the following description of a preferred embodiment. This description will be given in reference to the accompanying drawings wherein.

DETAILED DESCRIPTION

Architecture

Figure 1:
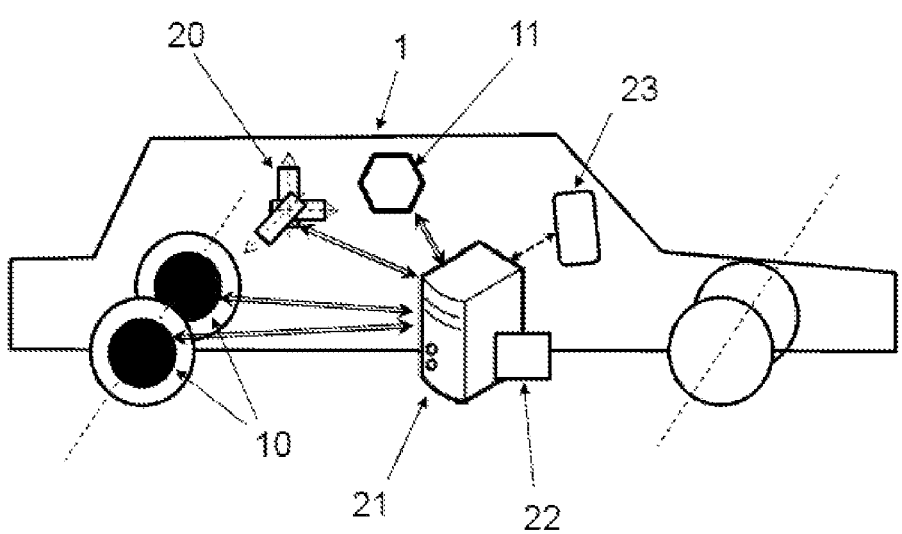
FIG. 1 shows a vehicle architecture example for the implementation of the method according to the invention.

In reference to FIG. 1, the present method allows the calibration of a gyrometer 11 of an object 1 moving in an ambient magnetic field (typically the terrestrial magnetic field, where applicable altered by nearby metallic objects), noted as M. As already explained, the magnetic field is a vector field in three-dimensional space, i.e. associating a three-dimensional vector with each three-dimensional point wherein the object 1 is movable.

This object 1 can be any movable object for which knowledge of the position is desired, for example a vehicle, in particular a vehicle with wheels, a drone, etc., but also a person or a portion of the body of this person (their hands, their head, etc.).

The object 1 is provided with the gyrometer 11 and magnetic measuring means 20. The means 20 and the gyrometer 11 are secured to the object 1, for example secured to the bodywork in the case of a vehicle, and generally fixed in the reference frame of the object 1.

The magnetic measuring means 20 are typically magnetometers and/or magnetic gradiometers. In this latter case, instead of measuring the value of the components of the magnetic field M, the gradiometers directly measure the value of the components of the gradient of the magnetic field M, i.e. the value of the spatial derivatives (optionally in addition to the magnetic field). Such magnetic gradiometers 20 are known to those skilled in the art. According to certain embodiments of the invention, it is possible to use gradiometers that directly measure the value of the second derivatives (gradient of order two), and in general i-th derivatives (gradient of order i).

In the rest of the description the example of magnetometers shall be used but those skilled in the art will know how to transpose it to gradiometers.

The magnetometer or magnetometers 20 are preferably "axial", i.e. able to measure a component of said magnetic field, i.e. the projection of said magnetic field vector M along their axis (or, in the case of a gradiometer, a component of a spatial derivative of order i of said magnetic field, i.e. the variation of a component of $\nabla^{i-1}M$ around the gradiometer along its axis).

The magnetometers 20 are at least in the number of two, and preferably at least in the number of three so as to be able to respectively acquire at least two or three components of the magnetic field. It is understood indeed that two magnetometers can suffice, if they are arranged orthogonally with respect to one another in a plane orthogonal to the vertical axis of rotation of the vehicle, i.e. a horizontal plane. However, using three magnetometers 20 and acquiring three components makes it possible to overcome the necessity of this particular provision.

Advantageously the magnetometers 20 are even of a number greater than three, such as six or even nine, advantageously organised by groups of three in "tri-axes", i.e. a triplet of orthogonal two-by-two magnetometers 20 associated with the same spatial position and measuring the magnetic field along the three axes (in the case of six magnetometers 20 there are two tri-axes and in the case of nine magnetometers 20 there are three tri-axes). Two tri-axes make it possible to measure the magnetic field as well as a portion of its gradient (see hereinbelow), and with eight magnetometers 20 that have been suitable positioned and oriented, all the components of the gradient can be determined. This is for example the case for three tri-axes positioned at the corners of a rectangular isosceles triangle.

Preferably, the orthonormed system associated with the object is chosen by convention (and by facility for the rest of the present description) such as tri-axes are advantageously oriented in accordance with said orthonormed system, in such a way as to facilitate the calculations.

But those skilled in the art will know in any case how to transpose to any spatial arrangement of magnetometers/gradiometers.

"Gyrometer" 11, means inertial measurement means able to measure the angular velocity of the object 1 according to a system of three orthogonal axes, that define the marker of the object 1, i.e. measure the three component of an angular velocity vector noted as ω. It is thus understood that the gyrometer 11 can in fact designate a set of three gyrometers associated with one of the three axes, in particular with a tri-axis arrangement (i.e. each one able to measure one of the three components of the angular velocity vector noted as ω).

In the preferred embodiment where the object 1 is a vehicle, this marker preferably comprises a vertical axis and two horizontal axes, in particular a longitudinal axis and a transversal axis. The rotation about the vertical axis of the vehicle is described by the angle on which the driver acts by turning the steering wheel. On a generally flat ground, the changes in direction of the vehicle are in the horizontal plane, i.e. also according to said vertical axis of the yaw. In reality, non-zero values for the roll (rotation along the longitudinal axis of the vehicle) and the pitch (rotation along the transversal axis of the vehicle) can be the result for example of a sloped road but are typically low.

The method object of the present invention makes it possible to calibrate the three components of the angular velocity vector ω.

The object 1 is furthermore advantageously provided with "additional" acquisition means 10 of a measured linear velocity of the object 1 (noted as V), i.e. of the displacement. These means 10 can directly or indirectly make it possible to obtain the linear velocity, and thus be of many types, for example inertial measurement means. Thus the gyrometer 11 can be supplemented by one or more accelerometers, and even the object 1 can comprise a "6-axis" inertial unit. Accelerometers are sensitive to external forces other than gravitational forced applied on this sensor, and make it possible to measure a specific acceleration noted as γ.

Alternatively, the means 10 can consist, if the object 1 is a vehicle with wheels, of at least two odometers each for a wheel of the vehicle, for example the two rear wheels, as shown in the example of FIG. 1. Note that a set of odometers is a simple and reliable means for obtaining a simple linear velocity.

"Odometer" means a piece of equipment able to measure the velocity of a wheel by counting the revolutions ("revolution counter") In general, odometers have a portion attached to the wheel (for example a magnet), and detect each passage of this fixed portion (called "top") in such a way as to count the number of revolutions per unit of time, which is the rotation frequency. Other techniques are known, for example the optical detection of a mask on the wheel, or the magnetometer of patent FR2939514 that detects the rotation of a metal object such as a wheel.

Here, the "velocity" of a wheel is a scalar, i.e. the norm of the velocity of the wheel in the terrestrial reference system (in the hypothesis of an absence of slipping). If the radius r of the wheel is known, the measurement of the rotation frequency makes it possible to estimate this norm of the velocity: $v=2\pi rf$.

Again alternatively, the additional means 10 can be a GNSS receiver. It will be understood that those skilled in the art are not limited to any particular technique for the velocity measurement.

The object 1 further comprises as explained processing means 21 (typically a processor) for the implementation in particular in real time of the processing of the present method, for example an on-board computer of a vehicle, and optionally a memory 22 and an interface 23 to return information on the movement of the object 1 (an instant velocity value, a heading, a position on a map, etc.), and/or send commands to the object 1. The object 1 can as such be in particular an autonomous vehicle, and the processing means 21 configured to implement the autonomous navigation of the vehicle. Thus, said commands are sent to the control members of the vehicle (engine, actuators of the steering wheel, etc.) so as to simulate the driving by a driver.

Note that the processing means 21 can be external to the object 1, and for example connected to the latter by a wireless network. Alternatively, the gyrometer 11 and the magnetic measurement means 20 can be connected to the data processing means 21 with wires, for example via Ethernet.

Method

The method object of this invention is a method for calibrating at least the gyrometer 11. "Calibration" means the determining of one or more calibration parameters, of which a list is provided hereinbelow. In particular, certain calibration parameters can be considered as reliable and predetermined, and others to be determined. Regarding those that are to be determined, it can be provided that they have "current" values (in other terms a calibration has already taken place), and that these values will where applicable be modified (in case of a new calibration).

In a particularly preferred embodiment, the method can furthermore be a method for calibrating magnetic measurement means 20, i.e. the gyrometer 11 and the magnetometers 20 can be calibrated simultaneously. This is an extremely advantageous mode, since as shall be seen there is even no more need to assume that one among the gyrometry (the gyrometric data) and the magnetometry (the magnetic data) is reliable to use it as a reference for calibrating the other: the two automatically calibrate each other. Alternatively, it will naturally be possible to consider the magnetometers 20 as well calibrated and to calibrate the gyrometer 20 consequently, which makes it possible for example to calibrate more parameters of the gyrometer 11.

As shall be seen, in an advantageous embodiment the present method is even a method for estimating the movement of the object 1, i.e. it comprises following the calibration, the use of measurements in order to reliably deduce therefrom one or more components of the movement.

In a first step (a), the method comprises the acquisition by the gyrometer 11 of a measured angular velocity of the object 1, noted as $\omega_{gyro}^{(measurement)}$, and by the magnetic measuring means 20, of at least two components of the magnetic field and/or of an i-th derivative of the magnetic field. These components are more precisely so-called measured components, forming a vector noted as $M^{(measurement)}$ in the case of the magnetic field (in the case of an i-th derivative, it can be noted as $\nabla_i M^{(measurement)}$). Preferably, three components of the angular velocity and at least six or even eight magnetic components are acquired (advantageously two or even three magnetometric tri-axes position in the corners of a rectangular isosceles triangle), in such a way as to be able to deduce therefrom the field and at least a portion of its gradient (i.e. the derivatives to the following order according to the three axes).

These magnitudes are advantageously measured with a sampling dt (i.e. every "dt" seconds) with dt very small before the characteristic time of the movements of the object 1, typically 40 ms.

In a step (b), the data processing means 21 determine the values of at least one calibration parameter of the gyrometer 11 minimising a first expression defined by an estimated angular velocity of the object 1 and at least one first magnetic equation on the components of the magnetic field and/or of an i-th derivative of the magnetic field.

The idea is to separately estimate gyrometric data and magnetic data which are theoretically linked by a magnetic equation. Thus thanks to the equation a quantity that ideally should be zero can be expressed (i.e. the gyrometric and magnetic data exactly satisfy the magnetic equation), otherwise it is the calibration that has to be perfected.

The estimated angular velocity of the object 1, noted as $\omega_{gyro}^{(estimation)}$, is according to the measured angular velocity and of the calibration parameters of the gyrometer 11, i.e. in general $\omega_{gyro}^{(estimation)}=g(\omega_{gyro}^{(measurement)})$ with a function (application) that is determined by the calibration parameters. In the simplest case, g is fine-tuned and $\omega_{gyro}^{(estimation)}$ is linked to the measured angular velocity $\omega_{gyro}^{(estimation)}$ by a formula of the type $\omega_{gyro}^{(estimation)}=D\cdot(\omega_{gyro}^{(measurement)}-b_{gyro})$, where D and $b_{gyro}$ represent the calibration parameters of the gyrometer 11.

In the case of a three-dimensional attitude, $b_{gyro}$ is a bias vector and D is a 3×3 matrix=(orthogonal matrix for transfer at the correct marker)×(higher triangular matrix containing the scale factors and the calibrations). In a simplified manner, it is possible for example to consider that D is predetermined (in practice it varies very slowly) and that the only calibration parameter to be determined for the gyrometer 11 is $b_{gyro}$, which effectively tends to vary over time (referred to as the drift of the gyrometer 11).

As explained, the components of the magnetic field and/or of an i-th derivative of the magnetic field acquired in step (a) are preferably measured components (i.e. potentially biased), and those used by said first magnetic equation are estimated components (the corresponding vector is noted as $M^{(estimation)}$ in the case of the magnetic field—in the case of an i-th derivative, it can be noted as $\nabla_i M^{(estimation)}$), according to the measured components and calibration parameters of the magnetic measuring means 20.

In the case where the magnetic measuring means 20 are magnetometers (i.e. work is done on the components of the magnetic field, not on a derivative), the estimated components $M^{(estimation)}$ of the magnetic field are advantageously linked to the measured components $M^{(measurement)}$ by a model of the form $M^{(measure)}=A \cdot M^{(estimation)}+b_{magneto}$, where the 3×3 matrix A and the vector $b_{magneto}$ are the calibration parameters of the magnetic measuring means 20. Wherein it is rather the estimated component that one wants to express as a function of the measured component, it is possible to write $M^{(estimation)}=A^{-1} \cdot (M^{(measurement)}-b_{magneto})$.

$b_{magneto}$ is generally representative of the "hard iron type" effects, and the matrix A representative of the "soft iron type" effects. These effects correspond to the hard/soft iron effects strictly speaking but can also include phenomena with the same impact but a different cause (for example effects due to the electronics/physics of the magnetometer 20).

As for the gyrometer, more generally, it is possible to examine a general error model: $M^{(estimation)}=h(M^{(measurement)})$ with h a function (application) that is not necessarily fine-tuned.

In the fine-tuned case ($M^{(measurement)}=A \cdot M^{(estimation)}+b_{magneto}$), A is a 3×3 matrix, that can be written as $A=R \cdot \tilde{A}$ with R orthogonal and $\tilde{A}$ higher triangular.

Note that it is assumed that the magnetic measuring means 20 themselves are a priori perfectly calibrated, it is only their direct environment (bodywork, etc.) which has to be corrected in calibration so as to be able to estimate the terrestrial magnetic field that would be measured in the absence of the object 1. The matrix R is therefore important and to be determined in such a way that the object magnetic marker remains stable.

The conventional calibration methods with respect to spheres determine R only at one rotation about the nearest axis (see document E. Dorveaux, D. Vissière, A. P. Martin, N. Petit, "*Iterative calibration method for inertial and magnetic sensors*", in Proc. of the 48*th IEEE Conf. on Decision and Control* 2009). The sensor axes do not remain fixed after the application of these methods.

It is possible in practice to determine eight coefficients of A in calibration (one coefficient, the global scale factor that connects the measurement to the physical unit in Tesla (or Gauss), cannot be determined, but, at the same time, it is not necessary to know it to calibrate the gyrometer 11).

Thus, in a particularly preferred embodiment of simultaneous double calibration, there are only three calibration parameters to be determined: $b_{gyro}$, A and $b_{magneto}$. This limited number of parameters makes such a double calibration possible when the object 1 has a "varied" trajectory (directions/velocities that have a large diversity of values as a function of time).

Magnetic Equation

The change in the magnetic field in the market of object 1 (referred to as body) over time is described by the equation $$\dot{M} = -\omega \times M + \nabla M \cdot V + \frac{\partial M}{\partial t}.$$

The first term $-\omega \times M$ describes the change in the field in the marker of the object 1 which is due to the rotation of this marker with respect to the fixed marker. The second term $\nabla M \cdot V$ describes the change in the measured field coming from the movement in a region with an inhomogeneous field. Finally, the third term $$\frac{\partial M}{\partial t}$$

takes the non-stationarities of the magnetic field into account (for example the periodical currents such as 50 Hz in Europe, movements of a magnet/an object made of steel in the vicinity of said object, etc.).

If there is no "movable" magnetic disturbance, i.e. the magnetic field has a stationary nature, $$\frac{\partial M}{\partial t} \approx 0,$$

and the equation can be reduced to $\dot{M}=-\omega \times M+\nabla M \cdot V$.

If there is no magnetic disturbance at all, i.e. the magnetic field has a uniform nature in addition to be stationary, $\nabla M \approx 0$ and the equation can be reduced further to $\dot{M}=-\omega \times M$.

In the case of a use of magnetic sensors to determine a heading, this double assumption of uniformity and stationarity is most often verified or assumed (as when using a compass). Indeed, for the terrestrial magnetic field, uniformity is locally observed as a very good approximation in our latitudes, except in the cases of the presence for example of a metallic structure or made of reinforced concrete (typically a bridge) in the surrounding area. The non-stationarities due to the displacements objects in the vicinity are even rarer because the sources of the disturbances would have to move, and any non-stationarities due to periodical currents are on the average zero and can also be processed with estimation techniques, see for example document C.-I. Chesneau, M. Hillion, and C. Prieur, *Motion estimation of a Rigid Body with an EKF using Magneto-Inertial Measurements*, 7*th Conf. on Indoor Positioning and Indoor Navigation* (*IPIN*' 16), Madrid, Spain, 2016.

Note that the possibility of generalising the magnetic equations (reduced or not) is known, in such a way as to link not the spatial and temporal variations of the magnetic field evaluated using magnetometer measurements, but the spatial and temporal variations of the magnetic gradients (i.e. the spatial variations of the magnetic field) evaluated in particular using gradiometer measurements. More precisely, the equation $\dot{M}=-\omega \times M+\nabla M \cdot V$ is derived as $\nabla_n \dot{M}=f_n(\omega) \cdot \nabla_n M+ g_n(\nabla_{n+1}M) \cdot V$, with $n+1 \geq i \geq 1$, where $\nabla_n M$ is an n-th derivative of the magnetic field, and $f_n$ and $g_n$ predetermined functions, see application FR1756675.

In the rest of the present description, by commodity, 0-order equations will be used (i.e. based on $\dot{M}=-\omega \times M+\nabla M \cdot V$), but those skilled in the art will know how to transpose the method to higher orders.

Figure 2:
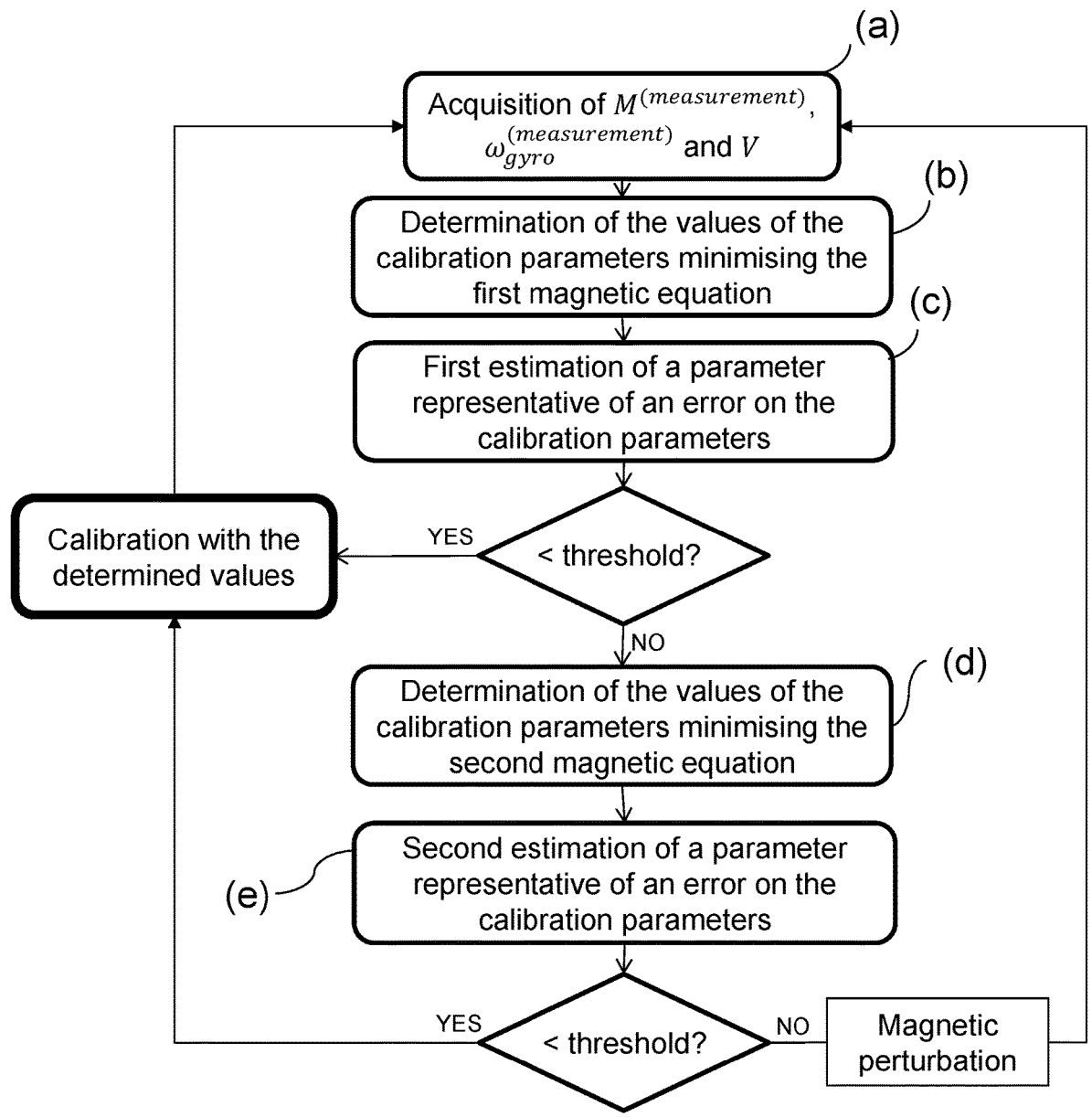
FIG. 2 is a diagram showing the steps of a preferred embodiment of the method according to the invention.

In reference to FIG. 2, the present calibration method cleverly proposes a calibration with several levels of assumption.

More precisely, in the step (b) it is initially attempted to calibrate the gyrometer by making the double assumption of uniformity and of stationarity of the field, then in an optional step (c) of estimating a parameter representative of an error on the calibration parameters the absence of disturbances is verified, i.e. the pertinence of the assumptions.

In a preferred embodiment, if this verification fails (said parameter representative of an error is greater than a predetermined threshold), the calibration is again attempted in a step (d) by making only the stationarity assumption (and no longer that of uniformity). It is then possible in a step (e) to reverify the pertinence of this assumption. Alternatively, if the verification of the step (c) fails (said parameter representative of an error is greater than a predetermined threshold), the method can be stopped and the current calibration kept.

It is understood that the presence of the step (d) however doers make it possible to carry out the calibration in the possible cases where the magnetic field is not uniform, with the condition of having the additional acquisition means 10 mentioned hereinabove. However, the invention is not limited to this embodiment and it is possible to have only the gyrometer 11 and the magnetic measuring means 20, and to implement only the steps (a), (b) and optionally (c).

The possible step (d) can thus comprise the acquisition by the additional acquisition means 10 of a measured linear velocity of the object 1, noted as V (in practice this acquisition can be implemented simultaneously with the other acquisitions of the step (a), in particular at each time step), then re-determining by the data processing means 21 values of at least one calibration parameter of the gyrometer 11 minimising a second expression defined by the estimated angular velocity of the object 1 and at least one second magnetic equation on the linear velocity and the components of the magnetic field and/or of an i-th derivative of the magnetic field, the at least one second magnetic equation assuming only that the magnetic field is stationary around the magnetic measurement means 20.

"Acquisition" is to be understood in the broad sense, i.e. direct or indirect. In practice the means 10 will most often measure a first magnitude which is not the linear velocity (accelerations, the rotation frequency of a wheel, etc.), and the so-called measured linear velocity is in fact estimated from these magnitudes, optionally combined. Those skilled in the art will know how to obtain in many ways ta linear velocity of the object 1, for example by magnetic gradiometry.

The at least one second equation assuming only that the magnetic field is stationary around the magnetic measurement means 20 used in step (d) is thus preferably of the form $\nabla_n M = f_n(\omega) \times \nabla_n M + g_n(\nabla_{n+1} M) \cdot V$, with $\omega$ the theoretical angular velocity, and as explained $\dot{M} = -\omega \times M + \nabla B \cdot V$ in the preferred embodiment wherein components of the magnetic field are measured directly.

It is therefore understood that in an assumption of stationarity of the magnetic field around the magnetic measurement means 20, the quantity $\nabla_n M^{(estimation)} - f_n(\omega_{gyro}^{(estimation)}) \times \nabla_n M^{(estimation)} - g_n(\nabla_{n+1} M^{(estimation)}) \cdot V$ (and in particular its version at order 0 $M^{(estimation)} + \omega_{gyro}^{(estimation)} \times M^{(estimation)} - \nabla M^{(estimation)} \cdot V$) is equal to zero at the nearest calibration errors.

Similarly the at least one first magnetic equation assuming that the magnetic field is uniform and stationary around the magnetic measurement means 20 used in step (b) is a simplified version of the at least one second equation, and is preferably of the form $\nabla_n M = f_n(\omega) \times \nabla_n M$, with as explained $\dot{M} = -\omega \times M$ in the preferred embodiment wherein components of the magnetic field are measured directly. It is therefore understood that in a double assumption of uniformity and of stationarity of the magnetic field around the magnetic measurement means 20, the quantity $\nabla_n M^{(estimation)} - f_n(\omega_{gyro}^{(estimation)}) \times \nabla_n M^{(estimation)}$ (and in particular its version at order 0 $M^{(estimation)} + \omega_{gyro}^{(estimation)} \times M^{(estimation)}$) is equal to zero at the nearest calibration errors.

It is seen that the first calibration is easy to implement because it does not require knowledge of the linear velocity V.

Advantageously, the first expression (minimised in the step (b)) is a function of $M^{(estimation)} + \omega_{gyro}^{(estimation)} \times M^{(estimation)}$, and preferably of $|M^{(estimation)} + \omega_{gyro}^{(estimation)} \times M^{(estimation)}|$ or of $(M^{(estimation)} + \omega_{gyro}^{(estimation)} \times M^{(estimation)})^2$; and the second expression (minimised in the step (d)) is a function of $M^{(estimation)} + \omega_{gyro}^{(estimation)} \times M^{(estimation)} - \nabla M^{(estimation)} \cdot V$, and preferably of $|M^{(estimation)} + \omega_{gyro}^{(estimation)} \times M^{(estimation)} - \nabla M^{(estimation)} \cdot V|$ or $(M^{(estimation)} + \omega_{gyro}^{(estimation)} \times M^{(estimation)} - \nabla M^{(estimation)} \cdot V)^2$. Under generic conditions, the minimisation of these expressions will give the parameters without ambiguity for a generic trajectory. It is understood however that alternatively those skilled in the art can use as a first/second expression any other functional sensitive to differences in relation to the relation defined by the first/second equation (normal $L^2$, $L^\infty$, etc.).

To implement this minimisation, the data processing means 21 can work over time on an interval of a given length. As such, in a known manner a recursive filter (RLS, recursive least squares, etc. methods) or an optimisation (least square method, etc.) can be used.

For example, in the assumption where the calibration parameters of the magnetometers 20, i.e. the parameters A and $b_{magneto}$, are simultaneously determined, it is possible to implement a so-called differential calibration principle wherein $\int |M^{(estimation)} + \omega_{gyro}^{(estimation)} \times M^{(estimation)}|^2 dt$ or $\int |M^{(estimation)} + \omega_{gyro}^{(estimation)} \times M^{(estimation)} - \nabla M^{(estimation)} \cdot V|^2 dt$, is minimised with $\omega_{gyro}^{(estimation)} = D \cdot (\omega_{gyro}^{(estimation)} + b)$ and $M^{(estimation)} = A^{-1} \cdot (M^{(measurement)} - b_{magneto})$ to the least squares.

Error Characterisation

As explained, the method advantageously comprises a step (c) of estimating a parameter representative of an error on the calibration parameters, and even more advantageously (if the steps (c) and (d) have taken place) a step (e) of a new estimating of said parameter representative of an error on the calibration parameters.

The idea is to estimate the quality of the information provided by the magnetic measuring means 20 in order to validate or not the levels of assumptions on the ambient magnetic field. More precisely, and as can be seen in FIG. 2:

if the first estimation (step (c)) of the parameter representative of an error is less than said predetermined threshold, the double assumption of uniformity and of stationarity of the ambient magnetic field is validated and the result of the calibration of the step (b) is accepted. The step (c) then comprises the effective calibration of the gyrometer 11 and/or of the magnetic measuring means 20 with the values determined in the step (b) of the calibration parameters, and there is no need to implemented the steps (d) and (e);

if the first estimation (step (c)) of the parameter representative of an error is greater than said predetermined threshold, the double assumption of uniformity and of stationarity of the ambient magnetic field is rejected and the result of the calibration of the step (b) is not accepted, and it is possible to either stop, or implement the recalibration of the step (d):

if the second estimation (step (e)) of the parameter representative of an error is this time less than said predetermined threshold, the assumption of only stationarity of the ambient magnetic field is validated and the result of the calibration of the step (b) is accepted. The step (e) then comprises the effective calibration of the gyrometer 11 and/or of the magnetic measuring means 20 with the values determined in the step (d) of the calibration parameters;

if the second estimation (step (e)) of the parameter representative of an error is always greater than said predetermined threshold, even the assumption of stationarity of the ambient magnetic field is rejected (there are perturbations present) and the result of the calibration of the step (d) is not accepted. The parameters of the former calibration are thus kept as calibration. It is then possible to either attempt to use the full magnetic equation (with the term $$\frac{\partial M}{\partial t}$$

or to temporarily discard the magnetic measurements.

Note that the determined values of the calibration parameters during an occurrence of step (b) and/or (d), but not used for the effective calibration, can be stored on the data storage means 12, and used during a future occurrence of the step (c) and/or (e). For example, it can be provided that as long as the parameter representative of an error is above the threshold, the determined calibration parameters are stored, and when passing below the threshold, the effective calibration also takes account of the stored values. Moreover, the result of the steps (c) and (e) can depend on the age of the former calibration parameters (for example via the value of the threshold).

Note that an accumulated error interval after a duration t since the last good calibration can be estimated according to this duration t and of the estimated error in this calibration, for example by adding to this error an increment that is proportional to the duration t. The predicted error interval can be used to characterise the result of a future calibration, and in particular to define the value of said predetermined threshold: for example the higher the error interval is, the more urgent it is to recalibrate the gyrometer, and thus the more "tolerant" one will be with the value of the parameter representative of an error (i.e. the predetermined threshold will be higher). Moreover, wherein the error interval increases proportionally faster when the estimated error is high, this makes it possible to retain for a long time the "good" calculations with a very low estimated error, while forcing faster a recalibration of the "not as good" calibrations.

Generally, said parameter representative of an error on the calibration parameters is a function of the value of the first/second expression (according to whether it is the first or second estimation occurrence of the parameter), calculated for the determined values of the calibration parameters.

A first embodiment of the step (c)/(e) is said to be intrinsic since it uses only magnitudes available in step (b)/(d). Preferably, estimation residues from step (b)/(d) are used, i.e. said parameter representative of an error is in particular the normal (for example $L^2$ or $L^\infty$) of the value of the first/second expression over a given time interval, typically $\int |\dot{M}^{(estimation)} + \omega_{gyro}^{(estimation)} \times M^{(estimation)}|^2 dt$ or $\int |\dot{M}^{(estimation)} + \omega_{gyro}^{(estimation)} \times M^{(estimation)} - \nabla M^{(estimation)} \cdot V|^2 dt$. In such a case, step (d)/(e) can be implemented at the same time with step (b)/(d). In the case of a recursive filter, the normal can be used (for example $L^2$ or $L^\infty$) of the innovation of the filter over a given period of time.

Alternatively, the deviation can be quantified in relation to a normal distribution, i.e. examine if the statistic of $\dot{M}^{(estimation)} + \omega_{gyro}^{(estimation)} \cdot M^{(estimation)}$ (or $\dot{M}^{(estimation)} + \omega_{gyro}^{(estimation)} \cdot M^{(estimation)} - \nabla M^{(estimation)} \cdot V$) is similar to a statistic of Gaussian noise or not, for example by calculating the moments of an order higher than 2.

In a second embodiment of the step (c)/(e), referred to as extrinsic, magnitudes of another type are used, in such a way as to calculate based on one or the other of these magnitudes a so-called reference angular velocity, so as to compare with the estimate angular velocity. And those skilled in the art will know how to calculate such a reference angular velocity from various types of magnitudes, and in particular it is possible to use for example:
- a steering wheel angle (if the object 1 is a vehicle),
- GNSS data, for example GPS, (if/when available),
- odometric data.

In the latter case, if the additional acquisition means 10 of a linear velocity consist of at least two odometers (still if the object 1 is a vehicle), said theoretical angular velocity can indeed be obtained from measured velocities of the wheels. In particular, in the case where the rear wheels are each provided with an odometer, assuming the Ackermann differential geometry, a second estimated angular velocity $\omega_{odo}^{(estimation)}$ of the object 1 is linked to the measured velocities $v_L$, $v_R$ respectively for the left rear wheel and the right rear wheel by a formula of the type $$\omega_{odo}^{(estimation)} = \frac{v_R - v_L}{d},$$

with d the distance between the wheels, and said parameter representative of an error is then in particular the norm (for example $L^2$ or $L^\infty$) of $|\omega_{\uparrow,gyro}^{(estimation)} - \omega_{odo}^{(estimation)}|^2$ over the given time interval, where $\omega_{\uparrow,gyro}^{(estimation)}$ is the angular velocity for the rotation alone about the vertical axis of the object 1.

According to a third embodiment, regarding the first occurrence (step (c)) of the estimation of the error parameter, it is very simply possible to estimate all or a portion of a spatial gradient of said component of the magnetic field and/or of an i-th derivative of the magnetic field, i.e. $\nabla M$ or $\nabla_{i+1} M$ according to the order of the second equation used.

Indeed, this estimation has to be close to zero so that the uniform nature is retained. It is understood that the estimation of a subset of components of the gradient can in practice be sufficient for this characterisation, because each non-zero component is already a manifestation of an inhomogeneity.

Alternatively or as a supplement, use can be made of learning to improve the estimation of this error parameter and/or develop an approach for identifying favourable conditions (i.e. stationary and uniform) in a more robust manner and with increased availability.

In particular, it is possible to implement learning mechanisms such as neural networks, machines with support vectors, nearest neighbour methods, decision trees, etc. Thus, at each occurrence of the steps (b) to (e), a learning base can be enriched wherein each dataset of measurements is "tagged" with the corresponding value of the parameter representative of an error, in such a way as to progressively (as the successive occurrences take place of steps (b) to (e)) and automatically learn to distinguish the acceptable calibrations from the unacceptable ones. Thus, the calibration is constantly improving itself.

Estimation of the Movement

As explained, the method advantageously comprises a step (f) of estimating by the data processing means 21 the movement of said object 1 according to the measured angular velocity of the object 1 and/or at least two components of the magnetic field and/or of an i-th derivative of the magnetic field, and/or of any measured linear velocity of the object 1 (by the means 10), and values of the calibration parameters, i.e. after recalibration. This step (f), which is not shown in FIG. 2 which focusses on the calibration, can be implemented continuously in parallel.

"Estimation of the movement" means in particular at least the estimation of an orientation of the object 1 (in the horizontal plane, i.e. a heading) and advantageously the estimation of a normal velocity. The orientation is typically obtained by integration of the angular velocity from a known initial orientation.

Preferably, the estimation by the data processing means 21 of the heading of said object 1 is only done according to the measured angular velocity of the object 1 and of the values of the calibration parameters, i.e. by using only the gyrometric data. In sum, the magnetic data is used to calibrate the gyrometer 11, and then for the estimating of the heady only the gyrometric data is used (since the latter is always available). Where applicable, the measured linear velocity (by the optional means 10) is used in step (f) only for determining a global velocity of the object 1.

Note that in a case of an autonomous vehicle, the step (f) can comprise the generation of a command of said vehicle 1 according to the estimated movement, in such a way as to take the vehicle 1 for example to a desired destination, or to stop the vehicle 1 by keeping it in a trajectory free of obstacles.

Equipment and Object

According to a second aspect, the invention in particular relates to a set of equipment 11, 20, 21 and optionally 10 for the implementation of one or the other of the embodiments of the method.

This set can be installed as a kit in a "conventional" object 1 in such a way as to transform it. Alternatively, in particular in the case where the object 1 is a vehicle, this can be an autonomous vehicle already provided with data processing means 21 for the navigation of the vehicle, as well as sensors such as the gyrometer 11 and/or odometers used as additional acquisition means 10.

An object 1 is in particular proposed, in particular of the vehicle with wheels type, comprising:
  a gyrometer 11 configured to acquire a measured angular velocity of the object 1;
  magnetic measuring means 20 which are configured to acquire at least two components of the magnetic field and/or of an i-th derivative of the magnetic field;
  where applicable, additional acquisition means 10 configured to acquire a measured linear velocity of the object 1 (advantageously odometers fitted on at least two of the wheels of the vehicle and configured to acquire measured velocities of said two wheels);
  data processing means 21 configured to
    determine values of at least one calibration parameter of the gyrometer 11 minimising a first expression defined by an estimated angular velocity of the object 1 and at least one first magnetic equation on the components of the magnetic field and/or of an i-th derivative of the magnetic field,
      the estimated angular velocity of the object 1 being a function of the measured angular velocity and of calibration parameters of the gyrometer 11, and
      the at least one first magnetic equation assuming that the magnetic field is uniform and stationary around the magnetic measurement means 20,
  the data processing means 21 can furthermore be configured to:
    Estimate a parameter representative of an error on the calibration parameters; and If said parameter representative of an error is greater than a predetermined threshold, re-determining values of at least one calibration parameter of the gyrometer 11 minimising a second expression defined by the estimated angular velocity of the object 1 and at least one second magnetic equation on the measured linear velocity and the components of the magnetic field and/or of an i-th derivative of the magnetic field, the at least one second magnetic equation assuming only that the magnetic field is stationary around the magnetic measurement means 20.

As explained hereinabove, the object 1 can furthermore comprise a memory 22 and an interface 23, as well as other sensors such as an angular sensor of the steering wheel or a GNSS receiver.

Moreover, the data processing means 21 can furthermore be configured to estimate a movement of said object 1 according to the measured angular velocity of the object 1, according to the measured angular velocity of the object, and/or of any measured linear velocity of the object 1 (where applicable according to the result of a comparison of said parameter representative of an error with a threshold), and of values of the calibration parameters.

Computer Program Product

According to a third and a fourth aspect, the invention relates to a computer program product comprising code instructions for the execution (on the processing means 21) of a method for calibrating a gyrometer 11 according to the first aspect of the invention, as well as storage means that can be read by a piece of computer equipment (for example data storage means 22) on which this computer program product is found.

The invention claimed is:

1. Method for calibrating a gyrometer of an object moving in an ambient magnetic field, the method being characterised in that it comprises the steps of:
  (a) Acquiring
    by the gyrometer, a measured angular velocity of the object, and
    by magnetic measurement means which are secured to said object, at least two measured magnetic components that are components of the magnetic field and/or of an i-th derivative of the magnetic field around the magnetic measurement means;
  (b) Determining, by data processing means, at least one candidate value for at least one calibration parameter of the gyrometer minimising a first expression defined by at least one first magnetic equation on an estimated angular velocity of the object and on representative magnetic components of the magnetic field and/or of an i-th derivative of the magnetic field around the magnetic measurement means,
    the estimated angular velocity of the object being a function of the measured angular velocity and of the at least one calibration parameter of the gyrometer,
    the representative magnetic components being a function of the measured magnetic components, and
    the at least one first magnetic equation assuming that the magnetic field is uniform and stationary around the magnetic measurement means; and
  (c) estimating a first error parameter representative of an error on the at least one candidate value and, if and only if said first error parameter is below a first predetermined threshold, calibrating the gyrometer with the at least one candidate value.

2. Method according to claim 1, wherein the estimated angular velocity $\omega_{gyro}^{(estimation)}$ of the object is linked to the measured angular velocity $\omega_{gyro}^{(measurement)}$ by a model $\omega_{gyro}^{(estimation)} = D \cdot (\omega_{gyro}^{(measurement)} + b_{gyro})$, where D and $b_{gyro}$ are the calibration parameters of the gyrometer.

3. Method according to claim 1, further comprising, if said first error parameter is above the predetermined threshold, a step (d) of determining, by the data processing means, at least one updated candidate value for the at least one calibration parameter of the gyrometer minimising a second expression defined by at least one second magnetic equation on the estimated angular velocity of the object and the measurement magnetic components, the at least one second magnetic equation assuming only that the magnetic field is stationary around the magnetic measurement means.

4. Method according to claim 3, wherein the second expression is a function of $\nabla_n M^{(estimation)} - f_n(\omega_{gyro}^{(estimation)}) \times \nabla_n M^{(estimation)} - g_n(\nabla_{n+1} M^{(estimation)}) \cdot V$, where $\nabla_n M$ is an n-th derivative of the magnetic field, $\omega$ the angular velocity, V the linear velocity, and $f_n$ and $g_n$ are predetermined functions.

5. Method according to claim 4, wherein said second error parameter is a mean of $|\nabla_n M^{(estimation)} - f_n(\omega_{gyro}^{(estimation)}) \times \nabla_n M^{(estimation)} - g_n(\nabla_{n+1} M^{(estimation)}) \cdot V|^2$ over a given time interval.

6. Method according to claim 3, wherein the step (d) comprises acquiring by additional acquisition means a measured linear velocity of the object, said at least one second magnetic equation also being on the measured linear velocity.

7. Method according to claim 6, comprising a step (e) of estimating a second error parameter representative of an error on the at least one updated candidate value and, if and only if said second error parameter is below a second predetermined threshold, calibrating the gyrometer with the at least one updated candidate value.

8. Method according to claim 7, wherein said second error parameter is a function of the estimated angular velocity, calculated with the at least one updated candidate value for the at least one calibration parameter of the gyrometer.

9. Method according to claim 1, wherein said first error is a function of:
   the estimated angular velocity, calculated with the at least one candidate value for the at least one calibration parameter of the gyrometer, or
   all or a portion of a spatial gradient of said measured magnetic components.

10. Method according to claim 1, wherein the at least one calibration parameter of the gyrometer has at least one current value determined at a previous calibration of the gyrometer, and the step (c) comprises determining an accumulated error interval that is a function of a previous error parameter representative of an error on the at least one current value and of a duration since the previous calibration of the gyrometer, said first predetermined threshold depending on said accumulated error interval.

11. Method according to claim 1, wherein the representative magnetic components are estimated magnetic components that are a function of the measured magnetic components and of calibration parameters of the magnetic measurement means, the step (b) also comprising determining at least one additional candidate value for at least one calibration parameter of the magnetic measurement means.

12. Method according to claim 11, wherein the magnetic measurement means (20) are tri-axes magnetometers, the estimated magnetic components $M^{(estimation)}$ being linked to the measured magnetic components $M^{(measurement)}$ by a model $M^{(measurement)} = A \cdot M^{(estimation)} + b_{magneto}$, where A and $b_{magneto}$ are the calibration parameters of the magnetic measurement means.

13. Method according to claim 1, wherein the first expression is a function of $\nabla_n M^{(estimation)} - f_n(\omega_{gyro}^{(estimation)}) \times \nabla_n M^{(estimation)}$, where $\nabla_n M$ is an n-th derivative of the magnetic field, $\omega$ the angular velocity, and $f_n$ is a predetermined function.

14. Method according to claim 13, wherein said first error parameter is a mean of $|\nabla_n M^{(estimation)} - f_n(\omega_{gyro}^{(estimation)}) \times \nabla_n M^{(estimation)}|^2$ over a given time interval.

15. Method according to claim 1, comprising a step (f) of estimating, by the data processing means, a movement of said object based on the measured angular velocity of the object, the measured magnetic components and the calibration parameters, wherein an orientation of the object is estimated in step (f) only as a function of the measured angular velocity of the object and of the calibration parameters.

16. A non-transitory computer-readable medium comprising a computer program product comprising code instructions for the execution of a method for calibrating a gyrometer according to claim 1.

17. Object moving in an ambient magnetic field, comprising a gyrometer configured to acquire a measured angular velocity of the object, magnetic measurement means configured to acquire at least two measured magnetic components that are components of the magnetic field and/or of an i-th derivative of the magnetic field, the object being characterised in that it further comprises data processing means configured to:
   determine at least one candidate value for at least one calibration parameter of the gyrometer minimising a first expression defined by at least one first magnetic equation on an estimated angular velocity of the object and on representative magnetic components of the magnetic field and/or of an i-th derivative of the magnetic field around the magnetic measurement means,
      the estimated angular velocity of the object being a function of the measured angular velocity and of the at least one calibration parameter of the gyrometer,
      the representative magnetic components being a function of the measured magnetic components, and
      the at least one first magnetic equation assuming that the magnetic field is uniform and stationary around the magnetic measurement means; and
   estimate a first error parameter representative of an error on the at least one candidate value and, if and only if said first error parameter is below a first predetermined threshold, calibrate the gyrometer with the at least one candidate value.

18. Object according to claim 17, wherein the data processing means is further configured to, if said first error parameter is above the predetermined threshold, determine at least one updated candidate values for the at least one calibration parameter of the gyrometer minimising a second expression defined by at least one second magnetic equation on the estimated angular velocity of the object and the measured components, the at least one second magnetic equation assuming only that the magnetic field is stationary around the magnetic measurement means.

19. Object according to claim 17, further comprising additional acquisition means for acquiring a measured linear velocity of the object, said at least one second magnetic equation also being on the measured linear velocity.

20. Object according to claim 19, being a vehicle with wheels, the additional acquisition means being at least two odometers fitted on the wheels of the vehicle.

\* \* \* \* \*